United States Patent
Fukui

(10) Patent No.: US 10,522,997 B2
(45) Date of Patent: Dec. 31, 2019

(54) LOAD CURRENT CONTROL APPARATUS

(71) Applicant: FDK CORPORATION, Tokyo (JP)

(72) Inventor: Norio Fukui, Tokyo (JP)

(73) Assignee: FDK CORPORATION, Tokyo (JP)

(*) Notice: Subject to any disclaimer, the term of this patent is extended or adjusted under 35 U.S.C. 154(b) by 248 days.

(21) Appl. No.: 15/555,926

(22) PCT Filed: Feb. 3, 2016

(86) PCT No.: PCT/JP2016/053248
§ 371 (c)(1),
(2) Date: Sep. 5, 2017

(87) PCT Pub. No.: WO2016/143419
PCT Pub. Date: Sep. 15, 2016

(65) Prior Publication Data
US 2018/0041022 A1 Feb. 8, 2018

(30) Foreign Application Priority Data
Mar. 6, 2015 (JP) ................. 2015-044459

(51) Int. Cl.
*H02H 3/093* (2006.01)
*H01L 23/367* (2006.01)

(52) U.S. Cl.
CPC .......... *H02H 3/093* (2013.01); *H01L 23/367* (2013.01)

(58) Field of Classification Search
CPC ....... H02H 3/093; H02H 3/087; H02H 3/0935
See application file for complete search history.

(56) References Cited

U.S. PATENT DOCUMENTS 7,672,106 B1* 3/2010 Sullivan ............... H05B 39/02
361/93.8
2011/0110009 A1 5/2011 Sugimoto et al.
2014/0347774 A1 11/2014 Uehara

FOREIGN PATENT DOCUMENTS

CN 201383674 Y 1/2010
EP 0860946 A2 8/1998
(Continued)

OTHER PUBLICATIONS

Extended European Search Report dated Oct. 2, 2018, received for corresponding European Application No. 16761391.8.
(Continued)

*Primary Examiner* — Scott Bauer
(74) *Attorney, Agent, or Firm* — Kinney & Lange, P.A.

(57) ABSTRACT

A load current control apparatus according to the present invention includes a current detecting circuit adapted to detect an electric current on a power supply line used to supply electric power from a power supply unit to a load device, a field effect transistor adapted to turn on and off the power supply line, and a controller adapted to control the field effect transistor according to the electric current on the power supply line, in which the controller starts counting time from a time point when the electric current on the power supply line exceeds the overcurrent detection threshold while maintaining the field effect transistor in an ON state, sets an upper limit time corresponding to the electric current on the power supply line at that time as a time threshold based on a relationship between electric current and time set beforehand according to electrical characteristics of the field effect transistor, and turns off the field effect transistor when a time period corresponding to the time threshold elapses.

2 Claims, 2 Drawing Sheets

(56) References Cited

FOREIGN PATENT DOCUMENTS

| EP | 2296243 A1 | 3/2011 |
|---|---|---|
| JP | 05-146050 | 6/1993 |
| JP | 10-041797 | 2/1998 |
| JP | 2001-119850 | 4/2001 |
| JP | 2003-046056 | 2/2003 |
| JP | 2004-226185 | 8/2004 |
| JP | 2014-158326 | 8/2014 |

OTHER PUBLICATIONS

International Search Report and Written Opinion dated Apr. 19, 2016, for corresponding PCT/JP2016/053248.

* cited by examiner

LOAD CURRENT CONTROL APPARATUS

BACKGROUND

Technical Field

The present disclosure relates to a load current control apparatus adapted to control an electric current flowing through a load device.

Background Art

In supplying electric power from a power supply unit to a load device, if a short fault or the like occurs, for example, on a load device or a power supply line, an excessive current significantly over rating might flow in the power supply unit or load device. To prevent such an overcurrent, a load current control apparatus adapted to control an electric current flowing through a load device is publicly known.

However, in a load device, an electric current larger than an electric current flowing steadily may flow temporarily for a short period of time. Therefore, for example, if a current threshold is set to detect an overcurrent based on the electric current flowing steadily on the load device, each time a larger electric current flows temporarily for a short period of time, a false detection of an overcurrent will occur. On the other hand, if a current threshold is set to detect an overcurrent based on the larger electric current flowing temporarily for a short period of time, there is fear that when a short fault or the like occurs, the overcurrent which primarily should be detected will not be detected or detection of the overcurrent will be delayed.

As an example of conventional techniques intended to solve the above problem, a switching circuit provided with an overcurrent detection function is publicly known, where by setting an overcurrent criterion beforehand, for example, according to electric characteristics of a specific load device (electric characteristics of a lumped load), the switching circuit changes control of a semiconductor switching element adapted to turn on and off a power supply line when the overcurrent criterion is met (see, for example, Patent Document 1). Also as another example of the conventional techniques, a load current control apparatus is publicly known, where in relation to, for example, a load device (lumped load) for which it is predictable when an electric current larger than an electric current flowing steadily flows, the load current control apparatus avoids detecting an overcurrent by masking an overcurrent detection signal just when an electric current larger than the electric current flowing steadily flows (see, for example, Patent Document 2).

PRIOR ART DOCUMENT

Patent Document

Patent Document 1: Japanese Patent Laid-Open No. 10-41797
Patent Document 2: Japanese Patent Laid-Open No. 2001-119850

SUMMARY

Problems to be Solved

However, any of the conventional techniques described above sets an overcurrent criterion beforehand based on the characteristics of a specific load device (characteristics of a lumped load), and changes overcurrent detection control (setting of a current threshold, setting of a masking condition, or the like) based on the overcurrent criterion. Therefore, with the aforementioned conventional techniques, the load device to which the techniques are applicable is limited to a specific load device (lumped load), and the techniques cannot be used for load current control of load devices other than the specific load device. This poses a problem of extremely low versatility.

Also, all the conventional techniques described above give consideration to the characteristics of only a specific load device (characteristics of a lumped load). That is, the conventional techniques described above do not give any consideration, for example, to electrical characteristics of the semiconductor switch adapted to turn on and off the power supply line used to supply electric power from a power supply unit to the load device or heat dissipation characteristics of a heat radiator such as a heat sink adapted to dissipate heat generated by the semiconductor switch. Therefore, the conventional techniques described above might incur unnecessary cost increases of the load current control apparatus due to overspecification of the semiconductor switch or heat radiator.

The present disclosure has an object to provide a load current control apparatus with high versatility at low cost.

Means for Solving the Problems

<First Aspect>

In order to achieve the above object, a first aspect of the present disclosure is directed to providing a load current control apparatus, including: a current detecting circuit adapted to detect an electric current on a power supply line used to supply electric power from a power supply unit to a load device; a semiconductor switch adapted to turn on and off the power supply line; and a controller adapted to control the semiconductor switch according to the electric current on the power supply line, wherein the controller maintains the semiconductor switch in an ON state while the electric current on the power supply line is equal to or smaller than an overcurrent detection threshold, starts counting time from a time point when the electric current on the power supply line exceeds the overcurrent detection threshold while maintaining the semiconductor switch in the ON state, identifies an upper limit time corresponding to the electric current on the power supply line at that time based on a relationship between electric current and time set beforehand according to electrical characteristics of the semiconductor switch, and sets the upper limit time as a time threshold, and turns off the semiconductor switch when a time period corresponding to the time threshold elapses without the electric current on the power supply line falling to or below the overcurrent detection threshold.

When the electric current on the power supply line exceeds the overcurrent detection threshold, the controller starts counting time from that time point while maintaining the semiconductor switch in the ON state. Also, the controller sets the time threshold, provided that the electric current on the power supply line exceeds the overcurrent detection threshold. The time threshold is set as the upper limit time corresponding to the electric current on the power supply line at that time based on the relationship between electric current and time set beforehand according to the electrical characteristics of the semiconductor switch.

The controller turns off the semiconductor switch when a time period corresponding to the time threshold elapses without the electric current on the power supply line falling to or below the overcurrent detection threshold. This makes it possible to detect any overcurrent caused, for example, by a short fault or the like in a load device and thereby immediately stop power supply from the power supply unit to the load device. On the other hand, if the electric current on the power supply line falls to or below the overcurrent detection threshold before a time period corresponding to the time threshold elapses, the controller maintains the semiconductor switch in an ON state. Consequently, even if, for example, an electric current (electric current in excess of the overcurrent detection threshold) larger than an electric current (electric current equal to or smaller than the overcurrent detection threshold) flowing steadily may flow temporarily for a short period of time, the current flowing temporarily is not detected as an overcurrent and the semiconductor switch is maintained in the ON state, allowing the power supply from the power supply unit to the load device to be continued.

In the first aspect of the present disclosure, the time threshold is set according to the electric current on the power supply line at that time based on the relationship between electric current and time set beforehand according to the electrical characteristics of the semiconductor switch. This enables load current control independent of electrical characteristics unique to each load device. Also, an allowable range of the electric current in excess of the overcurrent detection threshold can be maximized to the extent permissible in view of the electrical characteristics of the semiconductor switch. Therefore, the first aspect of the present disclosure enables load current control having high versatility and reduces the risk of overspecifying the semiconductor switch.

Consequently, the first aspect of the present disclosure has the operational advantage of providing a load current control apparatus with high versatility at low cost.

<Second Aspect>

According to a second aspect of the present disclosure, the load current control apparatus according to the first aspect of the present disclosure further comprises a heat radiator adapted to dissipate heat generated by the semiconductor switch, wherein the relationship between electric current and time is set beforehand according to the electrical characteristics of the semiconductor switch and heat dissipation characteristics of the heat radiator.

In the second aspect of the present disclosure, the time threshold is set according to the electric current on the power supply line at that time based on the relationship between electric current and time set beforehand according to the electrical characteristics of the semiconductor switch and the heat dissipation characteristics of the heat radiator. Consequently, the allowable range of the electric current in excess of the overcurrent detection threshold can be maximized to the extent permissible in view of not only the electrical characteristics of the semiconductor switch, but also the heat dissipation characteristics of the heat radiator. Therefore, the second aspect of the present disclosure enables load current control having higher versatility and further reduces the risk of overspecifying the semiconductor switch.

<Third Aspect>

According to a third aspect of the present disclosure, in the load current control apparatus according to the first or second aspect of the present disclosure, if the electric current on the power supply line changes before the time period corresponding to the time threshold elapses, the controller identifies an upper limit time corresponding to the electric current after the change based on the relationship between electric current and time while continuing to count the time and updates the time threshold with the upper limit time corresponding to the electric current after the change.

In the third aspect of the present disclosure, if the electric current on the power supply line changes before the time period corresponding to the time threshold elapses, the controller just continues counting time, identifies an upper limit time corresponding to the electric current after the change based on a preset relationship between electric current and time, and updates the time threshold. Consequently, even if the electric current on the power supply line changes before the time period corresponding to the time threshold elapses, load current control can be performed appropriately by changing the time threshold flexibly according to the change in the electric current.

Advantageous Effects

The present disclosure can provide a load current control apparatus with high versatility at low cost.

DETAILED DESCRIPTION

An embodiment of the present invention will be described below with reference to the accompanying drawings.

It should be noted that the present invention is not particularly limited to the embodiment described below and it goes without saying that various modifications are possible within the scope of the invention described in the claims.

A configuration of a load current control apparatus 10 according to the present disclosure will be described with reference to FIG. 1.

Figure 1:
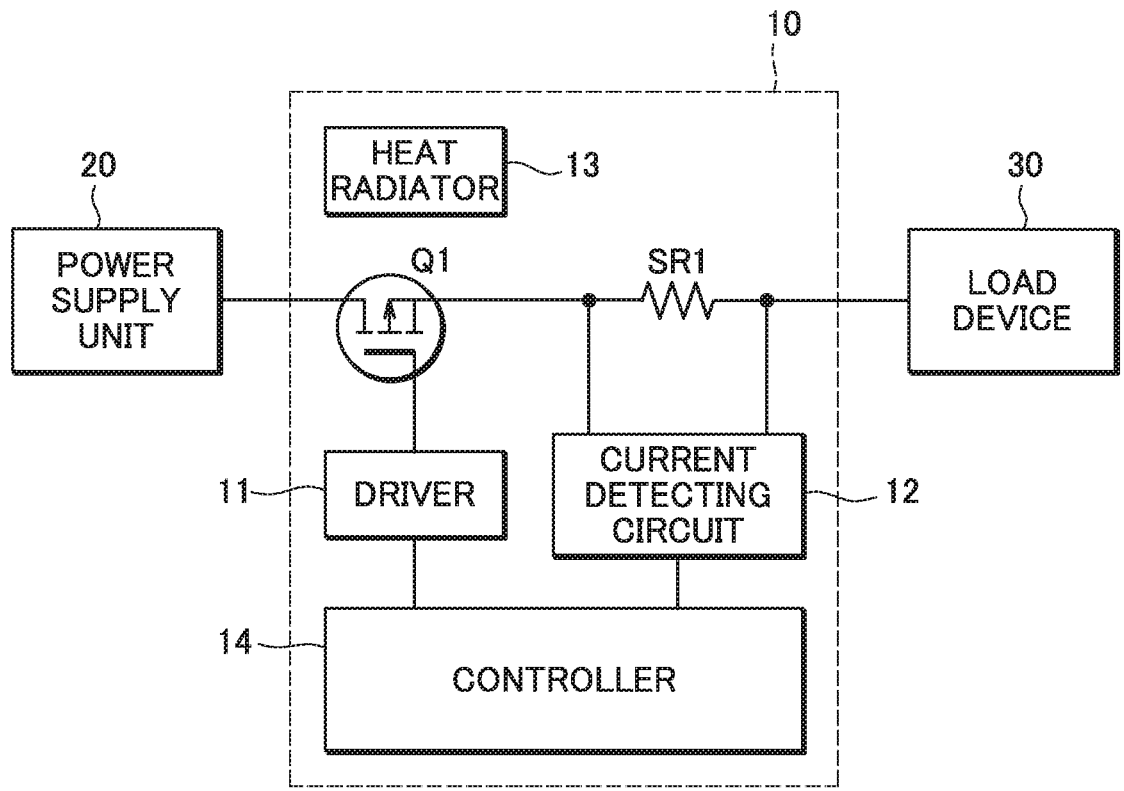
FIG. 1 is a block diagram illustrating a configuration of a load current control apparatus according to the present disclosure.

FIG. 1 is a block diagram illustrating a configuration of the load current control apparatus 10 according to the present disclosure.

The load current control apparatus 10 according to the present disclosure includes a field effect transistor Q1, a shunt resistor SR1, a driver 11, a current detecting circuit 12, a heat radiator 13, and a controller 14.

The field effect transistor Q1 as a "semiconductor switch" turns on and off a power supply line used to supply electric power from a power supply unit 20 to a load device 30. The driver 11 is a driving circuit that turns on and off the field effect transistor Q1 by controlling a gate voltage of the field effect transistor Q1. The field effect transistor Q1 is, for example, an enhancement-mode power MOSFET (Metal-Oxide-Semiconductor Field-Effect Transistor), but is not particularly limited to this, and may be, for example, a semiconductor switch such as a power transistor, an insulated gate bipolar transistor (IGBT), or a semiconductor relay (Solid-State Relay: SSR).

The shunt resistor SR1 is connected in series with the power supply line used to supply electric power from the power supply unit 20 to the load device 30. The current detecting circuit 12 detects an electric current on the power supply line used to supply electric power from the power supply unit 20 to the load device 30. More specifically, the current detecting circuit 12 detects a potential difference produced across the shunt resistor SR1 and calculates an electric current flowing through the power supply line, based on the potential difference.

The heat radiator 13 is a device adapted to dissipate heat generated by the field effect transistor Q1. The heat radiator 13 is, for example, a heat sink attached to the field effect transistor Q1, a cooling fan adapted to circulate air around the field effect transistor Q1, or the like.

The controller 14 is, for example, a publicly known microcomputer controller. Based on the electric current on the power supply line detected by the current detecting circuit 12, the controller 14 outputs a control signal to the driver 11, and thereby controls turning on and off of the field effect transistor Q1.

Figure 2:
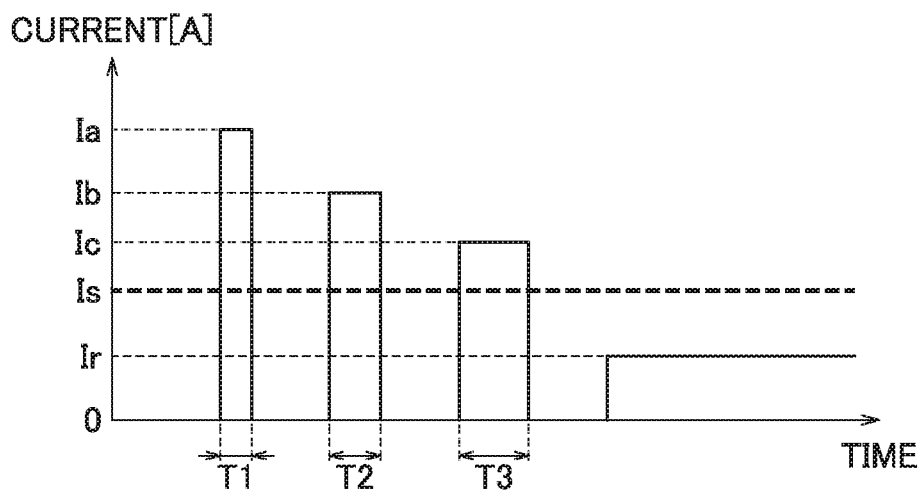
FIG. 2 is a timing chart of load current control on the load current control apparatus according to the present disclosure.
Figure 3:
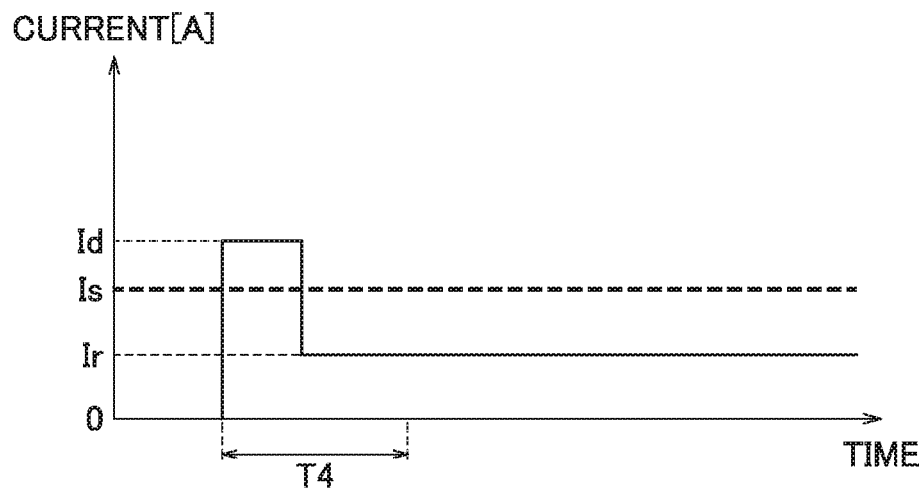
FIG. 3 is a timing chart of load current control on the load current control apparatus according to the present disclosure.
Figure 4:
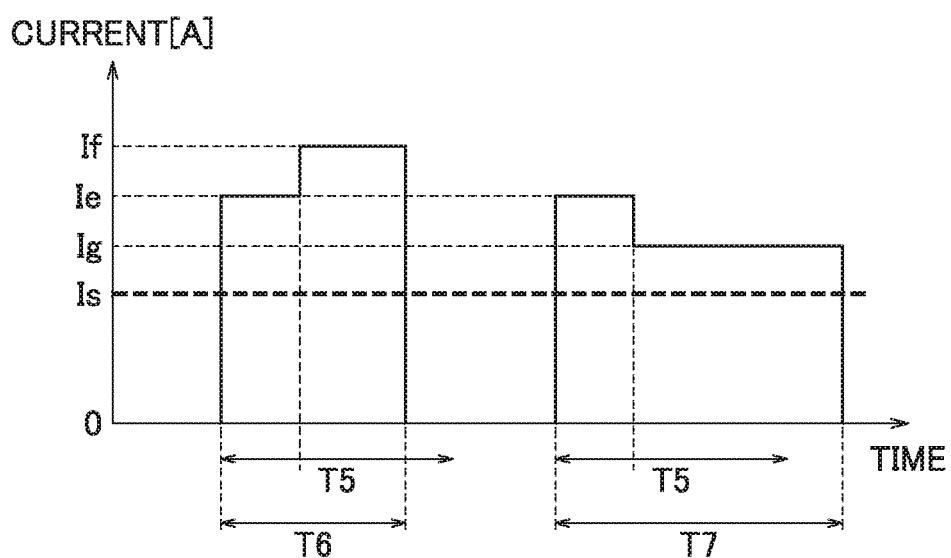
FIG. 4 is a timing chart of load current control on the load current control apparatus according to the present disclosure.

FIGS. 2 to 4 are timing charts illustrating load current control on the load current control apparatus 10 according to the present disclosure.

The controller 14 stores an overcurrent detection threshold Is set beforehand as a threshold for detecting an overcurrent of the electric current flowing through the power supply line used to supply electric power from the power supply unit 20 to the load device 30. The overcurrent detection threshold Is is a maximum value of an electric current (e.g., 10 A) allowed to flow continuously without limiting time on the load current control apparatus 10. The overcurrent detection threshold Is can be set, for example, based on a maximum rating of a drain current of the field effect transistor Q1. Besides, the overcurrent detection threshold Is may be set by taking into consideration the rated current of the power supply unit 20, load device 30, or the like as well.

The controller 14 stores a relationship between electric current and time set beforehand based on electrical characteristics of the field effect transistor Q1. The relationship between electric current and time may be set, for example, as a data table or may be set as some kind of relational expression or calculation formula. Examples of the electrical characteristics of the field effect transistor Q1 include drain current, pulsed drain current, allowable channel loss, maximum rating of allowable channel temperature, and maximum power dissipation of the field effect transistor Q1. The preset relationship between electric current and time is, more specifically, a correspondence between the electric current flowing through the power supply line and an upper limit time during which the electric current is allowed to flow continuously. Examples of the upper limit time set for the electric current flowing through the power supply line include: an upper limit time T1 set for an electric current Ia, an upper limit time T2 set for an electric current Ib, and an upper limit time T3 set for an electric current Ic. A relative relationship among the electric currents Ia, Ib, and Ic at this time is given by Ia>Ib>Ic (e.g., Ia=100 A, Ib=50 A, Ic=20 A). Also, the relative relationship among the upper limit times T1, T2, and T3 is given by T1<T2<T3 (e.g., T1=10 seconds, T2=30 seconds, T3=60 seconds).

The controller 14 maintains the field effect transistor Q1 in an ON state while the electric current on the power supply line is equal to or smaller than the overcurrent detection threshold Is (e.g., equal to a rated current Ir of the load device 30) (FIG. 2). On the other hand, at a time point when the electric current on the power supply line exceeds the overcurrent detection threshold Is, the controller 14 starts counting time from that time point while maintaining the field effect transistor Q1 in an ON state. Also, provided that the electric current on the power supply line exceeds the overcurrent detection threshold Is, the controller 14 identifies an upper limit time corresponding to the electric current on the power supply line at that time based on the preset relationship between electric current and time, and sets the upper limit time as a time threshold.

More specifically, if, for example, the electric current Ia in excess of the overcurrent detection threshold Is is flowing through the power supply line, the controller 14 sets the upper limit time T1 as the time threshold (FIG. 2). If, for example, the electric current Ib in excess of the overcurrent detection threshold Is is flowing through the power supply line, the upper limit time T2 is set as the time threshold (FIG. 2). If, for example, the electric current Ic in excess of the overcurrent detection threshold Is is flowing through the power supply line, the upper limit time T3 is set as the time threshold (FIG. 2).

The controller 14 turns off the field effect transistor Q1 at a time point when a time period corresponding to the time threshold elapses without the electric current on the power supply line falling to or below the overcurrent detection threshold Is. This makes it possible to detect any overcurrent caused, for example, by a short fault or the like in a load device 30 and thereby immediately stop power supply from the power supply unit 20 to the load device 30. More specifically, the controller 14 turns off the field effect transistor Q1, for example, at a time point when the upper limit time T1 elapses with the electric current Ia flowing continuously through the power supply line (FIG. 2). The field effect transistor Q1 is turned off, for example, at a time point when the upper limit time T2 elapses with the electric current Ib flowing continuously through the power supply line (FIG. 2). The field effect transistor Q1 is turned off, for example, at a time point when the upper limit time T3 elapses with the electric current Ic flowing continuously through the power supply line (FIG. 2).

On the other hand, if the electric current on the power supply line falls to or below the overcurrent detection threshold Is before the time period corresponding to the time threshold elapses, the controller 14 maintains the field effect transistor Q1 in an ON state. Consequently, even if, for example, an electric current (an electric current larger than the overcurrent detection threshold Is) larger than an electric current flowing steadily (e.g., an electric current equal to the rated current Ir of the load device 30) may flow temporarily for a short period of time, the current flowing temporarily is not detected as an overcurrent. Therefore, the field effect transistor Q1 is maintained in the ON state, allowing the power supply from the power supply unit 20 to the load device 30 to be continued. More specifically, if the electric current on the power supply line falls to or below the overcurrent detection threshold Is (e.g., to the rated current Ir of the load device 30) before an upper limit time T4 corresponding to the time threshold elapses, for example, with an electric current Id flowing through the power supply line, the controller 14 stops counting time, resets the time threshold, and maintains the field effect transistor Q1 in the ON state (FIG. 3).

As described above, according to the present disclosure, based on the relationship between electric current and time set beforehand based on the electrical characteristics of the field effect transistor Q1, the time threshold is set according to the electric current on the power supply line at that time. This enables load current control independent of electrical characteristics unique to each load device 30. Consequently, an allowable range of the electric current in excess of the overcurrent detection threshold Is can be maximized to the extent permissible in view of the electrical characteristics of the field effect transistor Q1. Therefore, the present disclosure enables load current control having high versatility and reduces the risk of overspecifying the field effect transistor Q1, making it possible to provide a load current control apparatus 10 with high versatility at low cost.

Furthermore, according to the present disclosure, preferably the relationship between electric current and time set beforehand is set, for example, based on the electrical characteristics of the field effect transistor Q1 and heat dissipation characteristics of the heat radiator 13 (e.g., thermal resistance of a heat sink, cooling performance of a cooling fan, or the like). Consequently, the allowable range of the electric current in excess of the overcurrent detection threshold Is can be maximized to the extent permissible in view of not only the electrical characteristics of the field effect transistor Q1, but also the heat dissipation characteristics of the heat radiator 13.

Besides, according to the present disclosure, preferably if the electric current on the power supply line changes before the time period corresponding to the time threshold elapses, the upper limit time corresponding to the electric current after the change is identified based on the preset relationship between electric current and time while continuing to count the time and the time threshold is updated with the upper limit time corresponding to the electric current after the change. Consequently, even if the electric current on the power supply line changes before the time period corresponding to the time threshold elapses, load current control can be performed appropriately by changing the time threshold flexibly according to the change in the electric current.

More specifically, for example, at the time point when the electric current on the power supply line exceeds the overcurrent detection threshold Is, the controller 14 starts counting time from that time point while maintaining the field effect transistor Q1 in an ON state. Also, based on the preset relationship between electric current and time, the controller 14 identifies an upper limit time T5 corresponding to an electric current Ie flowing through the power supply line at that time and sets the upper limit time T5 as the time threshold (FIG. 4).

In the above circumstances, if the electric current on the power supply line increases from the electric current Ie to an electric current If before the upper limit time T5 corresponding to the time threshold elapses, the controller 14 just continues counting time. Also, the controller 14 identifies an upper limit time T6 corresponding to the electric current If after the change based on the preset relationship between electric current and time, and updates the time threshold with the upper limit time T6 (FIG. 4). Then, the controller 14 turns off the field effect transistor Q1, for example, at a time point when the upper limit time T6 elapses with the electric current If flowing continuously through the power supply line (FIG. 4).

On the other hand, if the electric current on the power supply line decreases from the electric current Ie to an electric current Ig before the upper limit time T5 corresponding to the time threshold elapses, the controller 14 just continues counting time as well. Also, the controller 14 identifies an upper limit time T7 corresponding to the electric current Ig after the change based on the preset relationship between electric current and time, and updates the time threshold with the upper limit time T7 (FIG. 4). Then, the controller 14 turns off the field effect transistor Q1, for example, at a time point when the upper limit time T7 elapses with the electric current Ig flowing continuously through the power supply line (FIG. 4).

EXPLANATION OF REFERENCE SIGNS

10 Load current control apparatus
11 Driver
12 Current detecting circuit
13 Heat radiator
14 Controller
20 Power supply unit
30 Load device
Q1 Field effect transistor
SR1 Shunt resistor

The invention claimed is:

1. A load current control apparatus comprising:
a current detecting circuit adapted to detect an electric current on a power supply line used to supply electric power from a power supply unit to a load device;
a semiconductor switch adapted to turn on and off the power supply line; and
a controller adapted to control the semiconductor switch according to the electric current on the power supply line,
wherein the controller maintains the semiconductor switch in an ON state while the electric current on the power supply line is equal to or smaller than an overcurrent detection threshold,
starts counting time from a time point when the electric current on the power supply line exceeds the overcurrent detection threshold while maintaining the semiconductor switch in the ON state, identifies an upper limit time corresponding to the electric current on the power supply line at that time based on a predetermined relationship between electric current and time according to electrical characteristics of the semiconductor switch, and sets the upper limit time as a time threshold, and
turns off the semiconductor switch when a time period corresponding to the time threshold elapses without the electric current on the power supply line falling to or below the overcurrent detection threshold; and
wherein the load current control apparatus further comprises a heat radiator adapted to dissipate heat generated by the semiconductor switch, and the relationship between electric current and time is predetermined according to the electrical characteristics of the semiconductor switch and heat dissipation characteristics of the heat radiator.

2. The load current control apparatus according to claim 1, wherein if the electric current on the power supply line changes before the time period corresponding to the time threshold elapses, the controller identifies the upper limit time corresponding to the electric current after the change based on the relationship between electric current and time while continuing to count the time and updates the time threshold with the upper limit time corresponding to the electric current after the change.

* * * * *